United States Patent [19]

Turner et al.

[11] Patent Number: 4,896,129
[45] Date of Patent: Jan. 23, 1990

[54] MAGNETIC FIELD COILS

[75] Inventors: Robert Turner, Bramcote; Peter Mansfield; Barry L. W. Chapman, both of Beeston, all of England

[73] Assignee: National Research Development Corporation, London, England

[21] Appl. No.: 66,201

[22] Filed: Jun. 25, 1987

[30] Foreign Application Priority Data

Jun. 28, 1986 [GB] United Kingdom ................. 8615854

[51] Int. Cl.$^4$ ............................................. H01F 5/00
[52] U.S. Cl. ..................................... 335/299; 324/318
[58] Field of Search ................ 335/216, 299; 324/318, 324/319, 320

[56] References Cited

U.S. PATENT DOCUMENTS

4,701,736 10/1987 McDougall et al. ............... 335/299
4,710,741 12/1987 McGinley ........................... 335/299
4,724,388 2/1988 Sano et al. ........................... 324/318

Primary Examiner—George Harris
Attorney, Agent, or Firm—Cushman, Darby & Cushman

[57] ABSTRACT

A magnetic coil comprising a plurality of conductors is designed by calculation of the continuous current density required on the surface on which the conductors are positioned to generate a specific magnetic field on a further target surface or at specified points.

17 Claims, 7 Drawing Sheets

Fig. 3a z=0 plane

Uniformity maps for d= 1.5a and return path at z= 2.0a
Contours at 1% intervals as noted

| Wire | Positions |
|---|---|
| Arc | $z/a$ |
| 1 | 0.470 |
| 2 | 0.825 |
| 3 | 1.064 |
| 4 | 1.243 |
| 5 | 1.378 |
| 6 | 1.479 |
| 7 | 1.556 |
| 8 | 1.619 |
| 9 | 1.675 |
| 10 | 1.729 |
| 11 | 1.795 |
| 12 | 1.909 |

MAGNETIC FIELD COILS

BACKGROUND OF THE INVENTION

The present invention relates to magnetic field coils and more particularly to coils designed to produce a defined field in at least one volume.

In many applications it is important to provide a magnetic field the characteristic of which, for example, in an x-y plane is known. For example, in virtually every application of NMR spectroscopy and imaging it is essential to use magnetic fields whose spatial variation is controlled. Such fields may be uniform, or they may have a linear variation in either x, y or z (where x, y, z are the co-ordinate axes), or they may be uniform within a certain volume and rapidly changing elsewhere, as in TMR. For fine-tuning correction of nearly uniform main fields it is useful to have a set of shim coils, which provide known correction gradients, varying as xy, $x^2-y^2$, yz etc.

SUMMARY OF THE INVENTION

It is an object of the present invention to provide coils which are designed in a manner suitable for generating any of the fields mentioned.

The coils are formed by conductors which lie on a surface, and the positions of the conductors are derived directly from the specification of the field desired at a further target surface which may be smaller or larger than the former surface. Coils designed according to the principle to be described can provide very large volumes within which the field follows a specified variation, and are thus exceptionally efficient and compact.

According to the present invention, there is provided a magnetic coil including a plurality of conductors positioned on a surface or surfaces in which the positions of the conductors are determined by the calculation of the continuous current density required on that surface to generate a specified magnetic field everywhere on a further target surface or at specified points thereon, and calculation of conductor positions on the former surface which provide a good approximation to this current density.

In one class of preferred surfaces, the surface or surfaces are cylinders and the target surface or surfaces are also cylinders.

The cylinder on which the conductors are positioned may, for example, be a cylinder of a non-ferromagnetic material such as glass reinforced plastic, or the cylinder may be notional, the coils being merely shaped to conform to a cylindrical or partially cylindrical shape.

In a first preferred embodiment, the cylinder on which the coil conductors are to be mounted is of larger diameter than the diameter of the target cylinder, the coil therefore being designed to produce a known field within the cylinder. The target cylinder may be one fifth to one tenth the diameter of the cylinder or could be zero diameter.

In a second preferred embodiment the target cylinder is of larger diameter than the cylinder. This is particularly useful where a specified field is required outside a coil. A specific case is where a zero field is required outside a coil as is advantageous in NMR spectroscopy and imaging.

In a further embodiment the coil design may be obtained from calculations carried out on first and second target cylinders, the first being of smaller diameter and the second of larger diameter. The coil designed by this method can therefore produce defined magnetic fields both within the first cylinder and outside the second cylinder.

In a further embodiment a plurality of coaxial cylindrical or semi-cylindrical coils can be designed to produce various fields specified on target cylinders in all but one of the intervening spaces, and within the centre cylinder.

In a preferred embodiment the field within the inner cylinder is uniform and outside the outermost cylinder the field is zero. Alternatively, the inner field may be zero with a defined outer field.

The present invention provides a method of producing a coil wound on a surface to produce a desired magnetic field when energised including calculating the continuous current density required on the surface to generate a specified magnetic field on the surface of a target surface of different size, calculating conductor positions on the surface to provide a near approximation to this current density and winding the conductors onto the surface in the calculated positions.

BRIEF DESCRIPTION OF THE DRAWINGS

Embodiments of the present invention will now be described, by way of example with reference to the accompanying drawings in which:

FIGS. 3a, b, c and d show the design of a saddle coil for production of an x gradient (one octant only of the coil being shown) and uniformity maps for d=1.5a and return path at d=2.0a;

Figure 1:
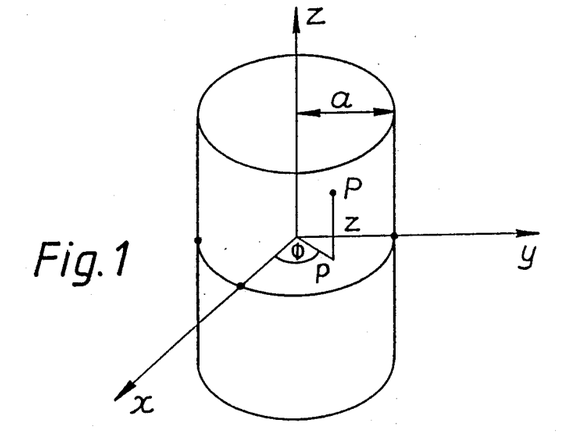
FIG. 1 shows a cylinder or notional cylinder used to explain the principle of the present invention.

The calculation of current density required to generate given field according to the present invention is given as follows:

The crucial observation leading to improved coil designs is that the z component of the magnetic field produced by the current density F ($\phi$, z) flowing on a cylinder of radius a (FIG. 1) is given by the following equation (see U.S. patent application 06/909,292 filed Sept. 19, 1986).

$$B_z(\rho, \phi, z) = \frac{-\mu_o a}{2\pi} \sum_{m=-\infty}^{\infty} \int_{-\infty}^{\infty} dk e^{im\phi} e^{ikz} k F_\phi^m(k) K_m'(ka) I_m(k\rho) \qquad (1)$$

where $$F_\phi^m(k) = \frac{1}{2\pi} \int_{-\pi}^{\pi} e^{-im\phi'} d\phi' \int_{-\infty}^{\infty} e^{-ikz'} dz' F_\phi(\phi', z')$$

Now suppose we are given $B_z(c, \phi, z)$ for a particular value of c<a that is to say, we are given the field on the further cylinder of radius c. We may invert equation (1) by integrating each side with respect to $\phi$ and z:

$$B_z(m', k') = \frac{1}{2\pi} \int_{-\infty}^{\infty} e^{im'\phi} d\phi \int_{-\infty}^{\infty} e^{-ik'z} dz B_z(c, \phi, z) = \quad (2)$$

$$-\mu_o a \, k' \, F_\phi^{m'}(k') \, K'_{m'}(k'a) \, I_{m'}(k'c)$$

Thus we may write $$F_\phi^m(k) = \frac{1}{\mu_o a} \frac{B_z(m, k)}{K'_m(ka) I_m(kc)} \quad (3)$$

The current density $F_o(\phi, z)$ may then be obtained:

$$F_\phi(\phi, z) = \frac{1}{2\pi} \sum_{m=-\infty}^{\infty} e^{-im\phi} \int_{-\infty}^{\infty} dk \, e^{-ikz} F_\phi^m(k) = \quad (4)$$

$$\frac{1}{2\pi\mu_o a} \sum_{m=-\infty}^{\infty} e^{-im\phi} \int_{-\infty}^{\infty} dk \, e^{-ikz} \frac{B_z(m, k)}{k \, K'_m(ka) \, I_m(kc)}.$$

Hence, given $B(o, \phi, z)$ we may obtain the required current $F_o(\phi, z)$. Note that the other component of the current in the cylinder, $F_z(\phi, z)$ can be obtained using the equation of continuity, which gives $$\frac{\partial F_z}{\partial z} = -\frac{1}{a} \frac{\partial F_\phi}{\partial \phi} \quad (5a)$$

or in terms of m and k:

$$k F_z^m(k) = -\frac{m}{a} F_\phi^m(k) \quad (5b)$$

Equation (4) has a certain peculiarity. For large k the denominator $kk_m^1(ka)I_m(kc)$ tends to $e^{-k(a-c)}$. Hence the integral in equation (4) will fail to converge unless $|B_z(m,k)|$ decreases faster than $e^{-k(a-c)}$ as $k \to \infty$. In particular this rules out the possibility of creating a field which has the form $$B_z = B_o \quad |z| < d$$
$$= 0 \text{ elsewhere,}$$

since this gives a $B_z(m, k)$ which decreases only as $1/k$.

A useful class of functions to describe the variation of $B_z(c, O, z)$ is the set $$g(z) = \frac{z^s}{1 + \left(\frac{z}{d}\right)^n} \quad (6a)$$

where s and n (n even) are integers. For $z < d/2$ this diverges from $z^s$ only by order of $(z/d)^n$, and the Fourier transform of $g(z)$ is well known. For large k this decreases as $e^{-kd \sin \pi/n}$, requiring that the characteristic length d of the coil must be such that $$d \sin \pi/n > a. \quad (6b)$$

For many imaging purposes it is sufficient to take n=6; this gives correction up to six order in the z direction. For instance, if a transverse gradient is to be uniform in the z direction, we take s=0. Then at $z = \pm d/2$ the magnitude of the gradient has dropped by only 1/64, i.e. 1.5%. Correction to higher order may be achieved by making n larger, but this increases the length of the coil.

The variation $B_z(c, \phi, z)$ may also be specified point by point, and the Fourier transform $B(m,k)$ computed numerically. It is still necessary to ensure that $B(m,k)$ decrease with k sufficiently fast for the integral in (4) to converge.

Note that most fields of interest have either cylindrical symmetry (m=0 in equation (1)) or reflection symmetry about the xz or yz plane (m=±1 in equation (1)). Thus we are normally dealing with $$F_\phi^o(k) = -\frac{1}{\mu_o a} \frac{B_z(0, k)}{k \, K'_o(ka) \, I_o(kc)} \quad (7)$$

or $$F_\phi^1(k) = -\frac{1}{\mu_o a} \frac{B_z(1, k)}{k \, K'_1(ka) \, I_1(kc)} \quad (8)$$

Once the continuous current distribution required to generate the specified field has been found, it is necessary to find practical means for approximating such a distribution as closely as possible. In one preferred embodiment these currents are confined to wire arcs. There are two ways of arranging such arcs; (a) equal current in each arc, i.e. series activated, and (b) equal voltage drop down each arc, i.e. parallel activated. It is considerably simpler to calculate the arc positions required in case (a), though case (b) can also be dealt with in an entirely satisfactory way, using an iterative method.

ARC POSITION ALGORITHM

The basic principle for finding n arc positions for series activation, given the surface current density, is to subdivide the surface of the cylinder into 2n areas, in each of which flows an equal integrated surface current. These areas are of course separated by contours of equal current density. The arc positions are then taken at the odd-numbered contours. In this way each arc carries the current for a surface area on each side of it, closely approximating the effect of a continuous current density. The approximation is valid for magnetic fields calculated at radii less than the cylinder radius minus half the arc separation at that position.

In practice this means calculating $$I_t(\phi, z) = \int_c^z F_\phi(0, z) dz - a \int_c^\phi F_z(\phi, z) d\phi \quad (9)$$

and finding the maximum value of $I_t(\phi,z) = I_o$, dividing $I_o$ by 2n where n=number of arcs, and setting $$\frac{I_c}{2n}(2m - 1) = I_t(\phi, z) \quad (10)$$

to determine the arc positions.

In certain cases the arc positions may be obtained more easily by integrating the relationship $$\frac{dz}{F_z(\phi, z)} = +\frac{a \, d\phi}{F_\phi(\phi, z)} \quad (11)$$

which is the differential equation specifying the contours of F directly. This gives, in general $$F_z(\phi,z)F_\phi(\phi,z) = F_\phi(\phi_o,z)F_z(\phi,z_o) \quad (11a)$$

where $z_o$ and $\phi_o$ are constants.

SPECIFIC CASES

It is advantageous to consider first the following examples which do not require the full target field approach.

(a) RF coil

Here it is well known that a continuous current density $F_z = I_o/a \sin\phi$ will give a uniform magnetic field in the x direction. An exceptionally good rf coil (FIG. 2) can be designed using filamentary currents placed according to the prescription of equation (9). The required current return paths are circular arcs, which can be placed at $z = \pm d$, sufficiently far from the region of interest for imaging that their effect can be neglected for $|z| > d/2$. For the straight section (9) gives $$I_i(\phi, z) = -a \int_c^\phi \frac{I_o}{a} \sin\phi \, d\phi$$
$$= I_o(1 - \cos\phi)$$

Figure 2:
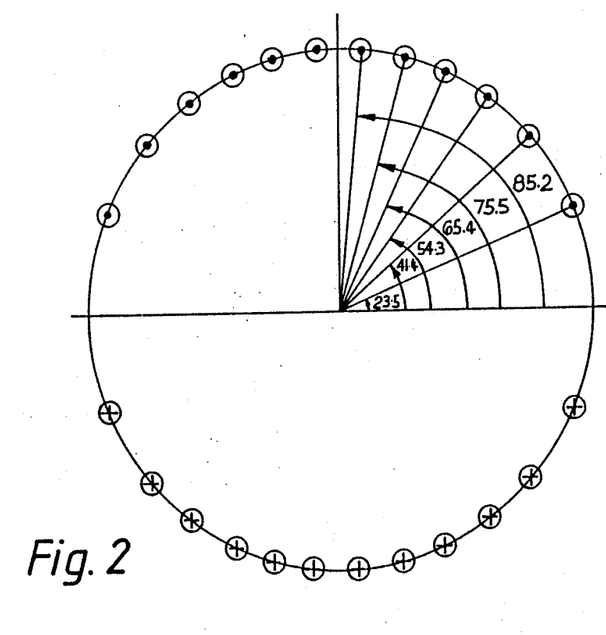
FIG. 2 shows an end view of a squirrel cage r.f. coil with six turns.
Figure 3A:
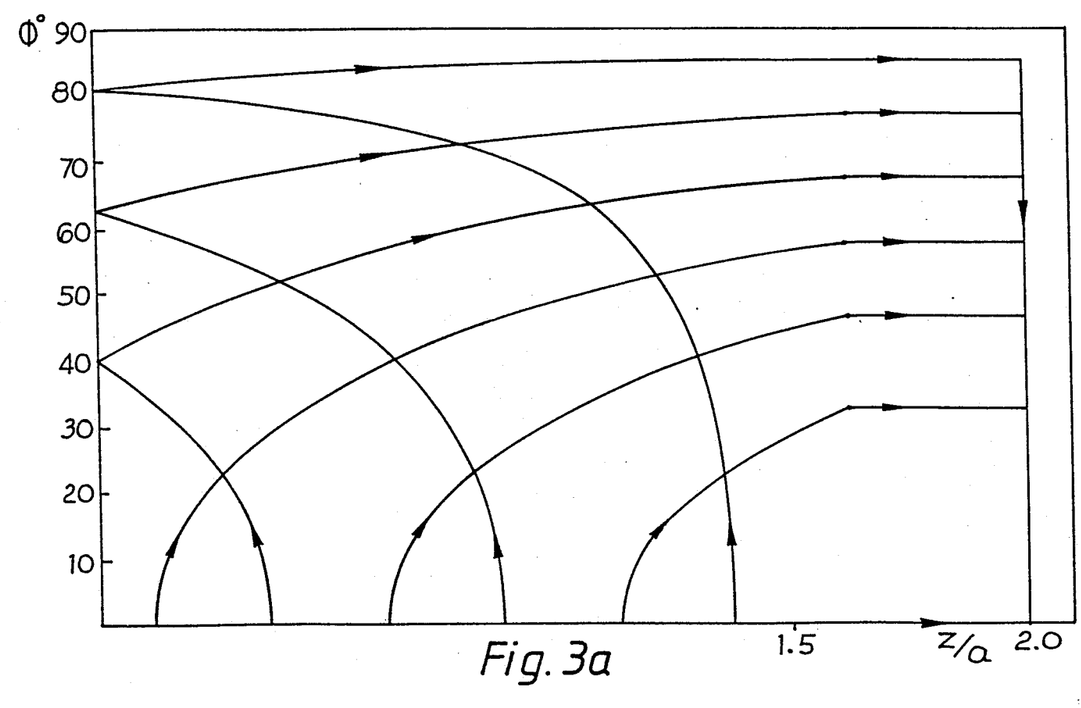
Figure 3B:
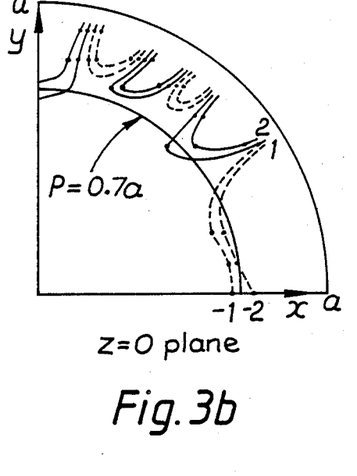
Figure 3C:
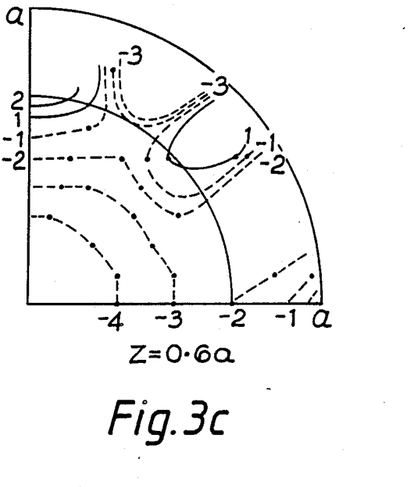
Figure 3D:
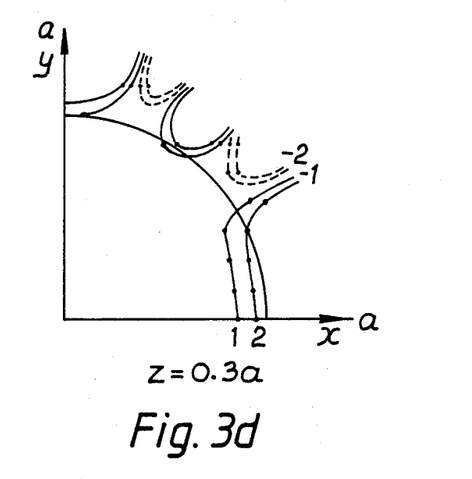

(10) then gives $$\frac{I_o}{2n}(2m - 1) = I_o(1 - \cos\phi_m) \quad (12)$$

So $\phi_m = \cos^{-1}\left(1 - \frac{m - 1/2}{n}\right)$

Straight line sections placed at these positions, corresponding to equal spacing in the x direction, give a remarkably uniform $B_x$ over a large volume. Generally, if the return path distance $d > 2a$, the field is uniform to 4% over a cylinder of length d and radius b, where $$b = a\left(1 - \frac{1}{2}\cos^{-1}\left(1 - \frac{1}{2n}\right)\right) \quad (13)$$

For $n = 6$, $b = 0.8a$.

By comparison, a typical saddle-type rf coil of similar dimensions, corresponding to $n = 1$ in equation (12), has a volume of similar uniformity of length 0.7d and radius 0.45a. The efficiency of the squirrel cage design, measured as the ratio of $B_x$ to the ampere-turns of wire used, is smaller by a few percent than a saddle coil of similar dimensions, though the efficiency of a saddle coil giving an equivalent volume of uniformity is less by a factor of two. Orthogonal arrangement of receiver and transmitter rf coils is achieved easily by rotating the coil design by $\pi/2$ about the z axis. The squirrel cage design may also be driven in a parallel arrangement, providing a very low effective inductance, and this is useful at high rf frequencies.

(b) Transverse gradient coil: no end-correction

An ideal transverse gradient, where $$B_z = xG = \rho G \cos\phi$$

can be achieved using a current density which has $m = \pm 1$ and no variation with z only (cf. equation (8)). Here $$B_z(\pm 1, k) = \frac{Gc}{4}\delta(k) \quad (14)$$

and $$F_\phi(\phi, z) = \frac{\pi}{2\mu_o} a G\cos\phi$$

Equation (5a) requires that $$\frac{\partial F_z}{\partial z} = \frac{\pi}{2\mu_o} G \sin\phi \quad (15)$$

$$F_z = \frac{z\pi}{2\mu_o} G \sin\phi$$

The arc positions may be found using equation (11):

$$\frac{dz}{\frac{z\pi}{2\mu_o} G \sin\phi} = \frac{a d\phi}{\frac{\pi}{2\mu_o} a G \cos\phi}$$

Taking the length of the coil to be d, $$\frac{d}{z} = \frac{\cos\phi}{\alpha}$$

where $\alpha$ = constant, defining a contour.

If n arcs are required, the position of the m'th arc is given by $$\cos\phi = \frac{d}{z} \cdot \frac{2m - 1}{2n} \quad (16)$$

Normally, to avoid undesirable transverse fields, a pair of such coils would be combined to provide symmetry about the $z = 0$ plane, as shown in FIG. 3. Here the two coils are overlapped to minimize the separation between adjacent wire segments, and hence tio maximize the radius of gradient uniformity. The current return paths are taken simply as circular arcs at $z = 1.25d$. Typically, for six-arc coils, with $d/a = 2$, the volume over which the gradient is uniform to within 5% is a cylinder of radius 0.8a and length 2a. Increasing the number of arcs will increase the total inductance, if they are driven in series, but will also increase the radius of the uniform gradient region.

Figure 4:
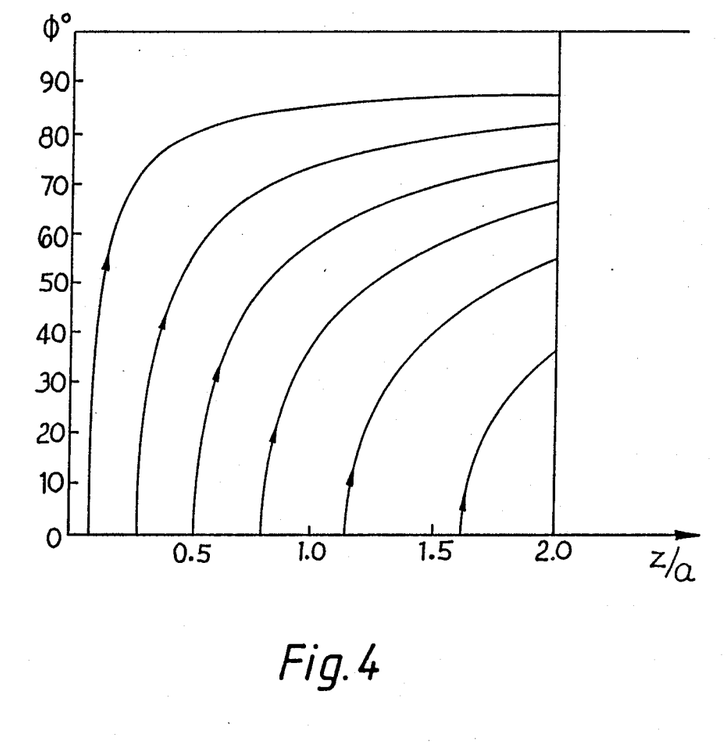
FIG. 4 shows a design of saddle coil (one octant only) for x gradient to be driven in parallel, the return paths not being shown.

The wires may alternatively be moved into positions where they can be driven in parallel, the current being then determined by the relative length of the arc. This is an efficient arrangement for maximising the volume of uniform gradient. An iterative program has been written to achieve this, a typical coil design being shown in FIG. 4.

(c) Transverse gradient coil: with end corrections

For this coil design it is necessary to specify the desired field $B_z$ more carefully to include the explicitly the effect of the current return paths. A combination of the functions g(z) described in equation (6a) is useful:

$$B_z(c,\phi,z) = \quad (17)$$

$$\left(\frac{d_2}{1 + \left(\frac{z}{d_1}\right)^6} - \frac{d_1}{1 + \left(\frac{z}{d_2}\right)^6}\right) \frac{G c \cos\phi}{(d_2 - d_1)}$$

Figure 5:
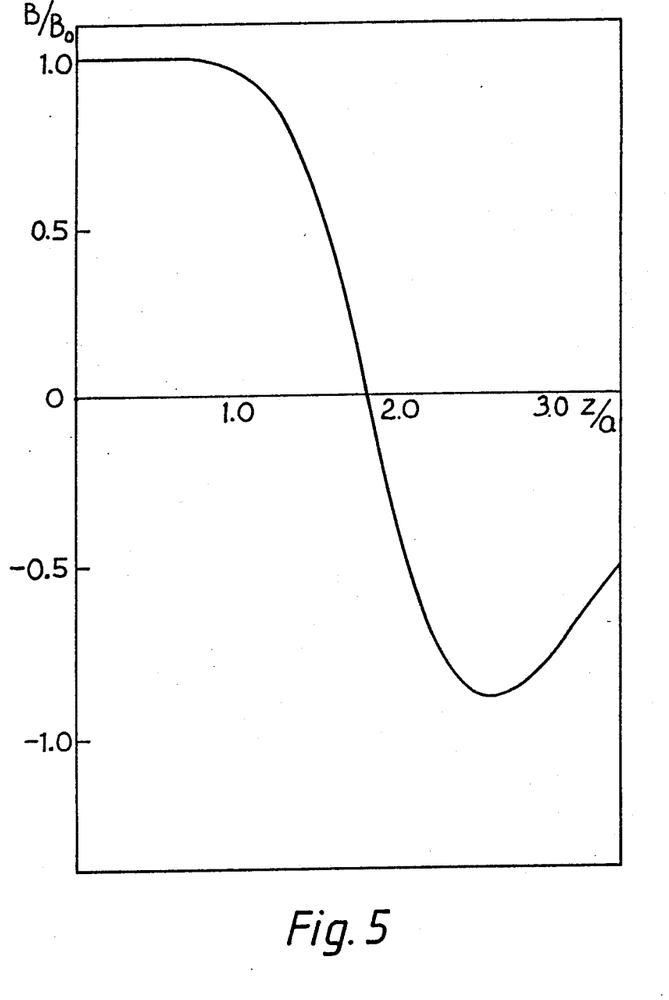
FIG. 5 shows the variation of target magnetic field ($B_z$) with z for an end corrected saddle coil.

This gives a variation with z shown in FIG. 5. For $|z| < d_1/2$ the uniformity is excellent along the z axis. Use of equation (2) then gives, for $m = \pm 1$ $$B_z(m,k) = \frac{G}{6} \frac{d_1 d_2}{d_2 - d_1} c \left[ 2e^{-d_1 k/2} \sin\left(\pi/6 + d_1 k \frac{\sqrt{3}}{2}\right) - \right. \tag{18}$$

$$\left. 2e^{-d_2 k/2} \sin\left(\pi/6 + d_2 k \frac{\sqrt{3}}{2}\right) + e^{-d_1 k} - e^{-d_2 k} \right]$$

and hence $$F_\phi^{\pm 1}(k) = \frac{-G d_1 d_2 c}{6\mu_0 a(d_2 - d_1)} \frac{1}{k K_1'(ka) I_1(kc)} \times \tag{19}$$

$$\left[ 2e^{-d_1 k/2} \sin\left(\frac{\pi}{6} + d_1 k \frac{\sqrt{3}}{2}\right) - \right.$$

$$\left. 2e^{-d_2 k/2} \sin\left(\frac{\pi}{6} + d_2 k \frac{\sqrt{3}}{2}\right) + e^{-d_1 k} - e^{-d_2 k} \right]$$

The integral in equation (4) converges for $$d_1 \geq \frac{a}{\sin \pi/6}$$

i.e.

$$d_1 \geq 2a$$

i.e.
$d_1 \geq 2a$
Note that $$- F_z^\pm(k) = \mp \frac{1}{ak} F_\phi^\pm(k) \tag{20}$$

Figure 6:
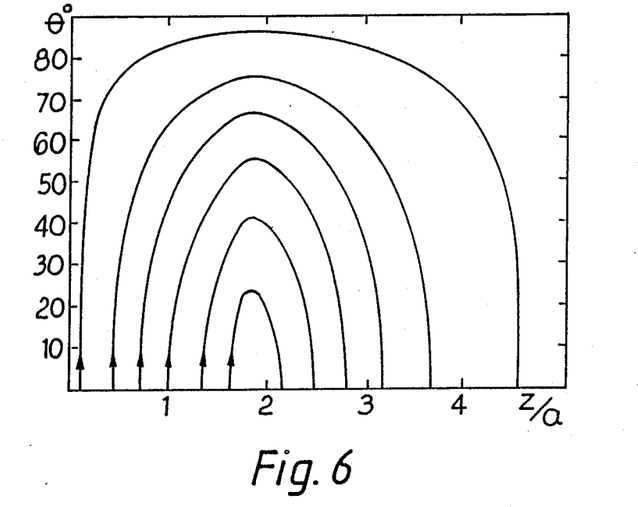
FIG. 6 shows a design of end corrected saddle coil (one octant only)

The arcs may be found as before, by setting $$\frac{2m - 1}{2n} I_0 = I(\phi, z) \tag{21}$$

with the results shown, for $n = 6$, in FIG. 6. Since for $z = 0$ and $\phi = \pi/2$ the wires are relatively widely spaced, it is preferable to have a larger number of turns n with this design. Given $d_1 = 2a$, $d_2 = 3a$ and $n \geq 10$, the coil gives a gradient which is uniform to 2% within a cylinder of radius 0.8a and length 2a.

(d) Longitudinal gradient coil
This coil is a distributed-arc version of the well known Maxwell pair arrangement. The target field $B_z$ is taken as $$B_z(c,\phi,z) = B_z(c,0,z) = \frac{Gz}{1 + \left(\frac{z}{z}\right)^{10}} \tag{22}$$

Then $$B_z(0,k) = \frac{G\pi d^2}{3}\left(2e^{-dk/2}\cos\left(\frac{\pi}{3} + dk\frac{\sqrt{3}}{2}\right) - e^{-dk}\right) \tag{23}$$

and $$F_\phi(\phi,z) = -\frac{d^2}{6\mu_0 a} \int_{-\infty}^{\infty} dk \frac{e^{-ikz}\left(2e^{-dK/2}\cos\left(\pi/3 + dk\frac{\sqrt{3}}{2}\right) - e^{-dk}\right)}{k K_0'(ka) I_0(kc)} \tag{24}$$

Figure 7:
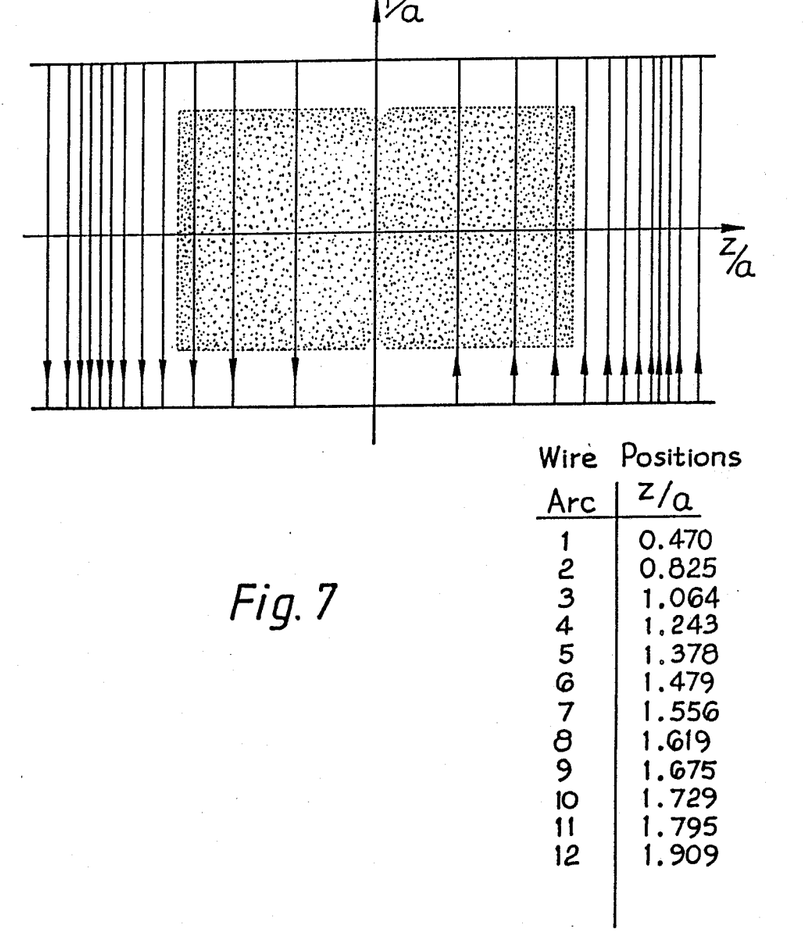
FIG. 7 shows a design of longitudinal gradient coil with 12 arcs.

The shortest coil achievable, using the given functional form of target field, has a length $2a\sqrt{3}$, which is double that of a conventional Maxwell pair, but a twelve turn version of this coil (FIG. 7) gives a linear z gradient which is uniform to 5% within a cylinder of radius 0.7a and length 2.0a, a volume six times larger than a comparable Maxwell pair.

Figure 8:
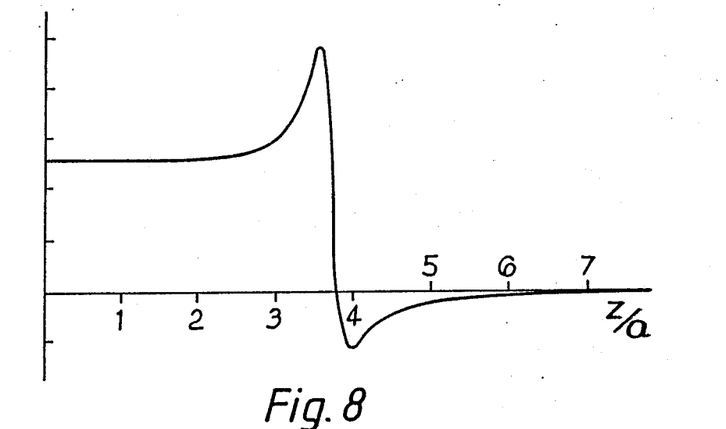
FIG. 8 shows the current density required to produce a uniform magnetic field.

(e) Uniform field coil
The algorithm described lends itself simply to the generation of highly uniform main magnetic fields. In order to provide correction to order $(z/d)^{12}$ it is necessary to have a coil length $d = a/\sin \pi/12 = 3.86a$. In return for this somewhat long configuration it is possible to achieve a magnetic field which is uniform to 0.2 ppm over 100% of the coil diameter and out to $z = \pm a$. The current density required (FIG. 8) can be provided using a large number of turns of wire, since for this application a high inductance causes no problems. Here $$B_z(c, \phi, z) = \frac{B_o}{1 + \left(\frac{z}{d}\right)^{12}} \tag{25}$$

and thus $$B_z(0, k) = \frac{B_o \pi d}{6} \sum_{s=1}^{6} e^{-dk\sin\frac{(2s-1)\pi}{12}} \sin\left[\frac{(2s-1)\pi}{12} + \right. \tag{26}$$

$$\left. dk \cos\frac{(2s-1)\pi}{12} \right]$$

$F(\phi,z) = F(o,z)$ is found using equations (3) and (4).

(f) Shim coils
The normal complement of shim coils provided for modern high quality magnets for spectroscopy or imaging consists of the following:

| | | |
|---|---|---|
| (i) | x | gradient |
| (ii) | y | gradient |
| (iii) | z | gradient |
| (iv) | xy | gradient |
| (v) | xz | gradient |
| (vi) | yz | gradient |

| | | |
|---|---|---|
| (vii) | $z^2$ | gradient |
| (viii) | $z^3$ | gradient |
| (ix) | $z^4$ | gradient |
| (x) | $x^2 - y^2$ | gradient |

Coils specified as in sections (b), (c) and (d) can supply the first order gradients over a large usable volume. In order to provide the remaining gradients using distributed windings, the desired magnetic fields may be specified as follows, with the appropriate azimuthal coefficient numbers m listed:

$$xy \; B_z(c,\phi,z) \propto c^2 \sin 2\phi g(z)$$
$$m = \pm 2$$

$$xz \; B_z(c,\phi,z) \propto c \cos\phi h(z)$$
$$m = \pm 1$$

$$yz \; B_z(c,\phi,z) \propto c \sin\phi h(z)$$
$$m = \pm 1$$

$$z^2 \; B_z(c,\phi,z) \propto z^2 g(z)$$
$$m = 0$$

$$z^3 \; B_z(c,\phi,z) \propto z^3 g(z)$$
$$m = 0$$

$$z^4 \; B_z(c,\phi,z) \propto z^4 g(z)$$
$$m = 0$$

$$x^2 - y^2 \; B_z(c,\phi,z) \propto c^2 \cos 2\phi g(z)$$
$$m = \pm 2$$

where $g(z) = \dfrac{1}{1 + \left(\dfrac{z}{d}\right)^6}$ and $h(z) = \dfrac{z}{1 + \left(\dfrac{z}{d}\right)^6}$ The current densities required to generate these fields, and thus the arc positions approximating them, can be derived as shown previously. In general these designs can be realised using many turns of wire, since shim coils are normally not switched, and therefore may be of high inductance. The volume over which these coils give the specified field to within 1.5% is then normally a cylinder of length 2a and radius a.

When specific fields are required in more than one region, the above principles can be applied to produce integrated coil design.

For example, consider the case of a screened coil system, where a target field B(r,z) is required in some interior region (r<a) and a second target field of B=O is required in the exterior region r>b. Two cylindrical surface currents are then necessary, at radii a and b, where b>a.

In this approach we generalize Equation 1 to $$0 = [bI_m'(kb)j_\phi^{1,m}(k) + aI_m'(ka)j_\phi^{2,m}(k)]K_m(kr) \quad (27a)$$

$$kB_z^m(k,r) = -\mu_0[bK_m'(kb)j_\phi^{1,m}(k) + aK_m'(ka)j_\phi^{2,m}(k)]I_m(kr) \quad (27b)$$

where $B_\phi(k,r)$ is the Fourier transform of the desired target field $j_\phi^1(z)$ is the surface current density on a cylinder radius b, and $j_\phi^2(z)$ is the surface current density on a cylinder of radius a. The Fourier transforms of the resulting current densities can be written explicitly as:

$$j_\phi^{1,m}(k) = \frac{-B_z^m(kr)}{\mu_0 bk I_m(kr)\left[K_m'(kb) - \dfrac{I_m'(kb)}{I_m'(ka)} \cdot K_m'(ka)\right]} \quad (28)$$

$$j_\phi^{2,m}(k) = \frac{-b}{a} \frac{I_m'(kb)}{I_m'(ka)} \cdot j_\phi^{1,m}(k) \quad (29)$$

For a uniform field B along the z-axis, a possible target function is $$B_z(z,r,\phi) = f(z)g(r,\phi) = B\left\{1 + \left(\frac{z}{p}\right)^l \left[1 - \exp-\left(\frac{z}{q}\right)^m\right]^{-1}\right\} \quad (30)$$

where p and q are assignable constants, l, m assignable integers and g(r,φ)=B is in this case independent of r and φ. By choosing l=3 we ensure that the far field varies as 1/z. Other types of coil may require specific r and φ dependence as reflected in g(r,o) together with a different value for l. For a short solenoid, the axial variation of field would go as $z^{1+m}$. The constant p is approximately equal to coil radius and q the coil half-length. The procedure is therefore to evaluate f(k) from Equation (30). Equations (27a and b) are then solved for $j_\phi^1(k)$ and $j_\phi^2(k)$. These current densities are then inversely transformed to yield the actual current density distributions. For a uniform field gradient along the z-axis, the target function is simply zf(z) with appropriate adjustments in l and m.

Although the Bessel functions are used as single hoop response functions, Equation (27) may be generalised to any coordinate system and arbitrary coil and screen geometry. In this case we may write Equation (30) generally as $$0 = B_{0,1}^e(k)j_1(k) + B_{0,2}^e(k)j_2(k) \quad (31a)$$

$$B^i(k) = -B_{0,1}^i(k)j_1(k), -B_{0,2}^i(k)j_2(k) \quad (31b)$$

where $B_{o,o}^\alpha(k)$ are the k-space unit current response functions for a line or loop element calculated from the Biot-Savart Law and evaluated along a path in real space externally (e) or internally (i) with respect to the loop element.

Further screens may be added. For n active screens a generalised n×n matrix equation is obtained:

$$B(k) = -B_o(k)j(k) \quad (32)$$

where $B_o(k)$ is the generalised transfer matrix for the set if screens. B(k) is the specified field or target response vector and j(k) the current density vector. For finite screen and/or coil currents, we also require det-$B_o(k) \neq 0$. So far we have considered specification of the target response vector along one coordinate axis. For specification along two axes B(k) or j(k) and $B_o(k)$ become 2nd and 3rd rank tensors respectively. It is therefore possible to completely specify the magnetic fields in n simply connected regions with n closed active screens. For open screens, the target fields can be approximated only over confined regions dependent on the required degree of approximation and the geometry of the screens.

The above description is mainly concerned with screening fields, so that beyond a given radius, the field vanishes. However from the analysis presented the reverse case may also have application. For example, generation of magnetic fields of known spatial dependence external to the coil system structure could be useful in surface coil design and also in the design of magnets, gradient coils and RF coils in oil borehole NMR spectrometers.

We claim:

1. A magnetic coil including a plurality of conductors positioned on a surface of the magnetic coil, the positions of the conductors being determined by a calculation of a continuous current density required on that surface to generate a specified magnetic field and by calculation of conductor positions on the surface of the magnetic coil which correspond to the current density.

2. A magnetic coil as claimed in claim 1 in which the surface of the magnetic coil is a first cylinder and the specified magnetic field is generated on a target cylinder.

3. A magnetic coil as claimed in claim 2 in which the first cylinder is a cylinder of a non-ferromagnetic material, the coils being shaped to conform to a cylindrical shape.

4. A magnetic coil as claimed in claim 2 in which the first cylinder is of larger diameter than the diameter of the target cylinder, the coil being designed to produce a known field within the target cylinder.

5. A magnetic coil as claimed in claim 4 in which the target cylinder is one fifth to one tenth the first diameter of the cylinder.

6. A magnetic coil as claimed in claim 4 in which the target cylinder is of zero diameter.

7. A magnetic coil as claimed in claim 4 in which the second cylinder is of larger diameter than the first cylinder.

8. A magnetic coil as claimed in claim 2 in which the target cylinder comprises first and seciond target cylinders, the first target cylinder having a smaller diameter than the first cylinder and the second target cylinder having a larger diameter than the first cylinder.

9. A magnetic coil as claimed in claim 8 in which a plurality of coaxial cylindrical coils are designed to produce various fields specified on the target cylinders in intervening spaces, and within a central cylinder.

10. A magnetic coil as claimed in claim 9 in which the field within the first target cylinder is uniform and the field outside the second target cylinder is zero.

11. A magnetic coil as claimed in claim 9 in which the field inside the first target cylinder is zero.

12. A method of producing a coil wound on a first surface to produce a desired magnetic field when energized, including the steps of:

calculating a continuous current density required on the first surface to generate a specified magnetic field on a second surface of a target surface of different size calculating conductor positions on the first surface to provide a near approximation to the current density, and winding the conductors onto the first surface in the calculated positions.

13. A method for designing positions for conductors of a magnetic coil having a first surface in order to obtain a desired magnetic field, comprising the steps of:

calculating a continuous current density on the first surface necessary to generate the desired magnetic field; and determining said conductor positions that correspond to said calculated current density, the desired magneticfield being generated when said conductors are energized.

14. A method as recited in claim 13, wherein the desired magnetic field is generated at a predetermined second surface.

15. A method as recited in claim 14, wherein the first and second surfaces are cylindrical.

16. A method as recited in claim 15, wherein the first surface has a greater cylindrical diameter than the second surface.

17. A method as recited in claim 16, wherein the cylindrical diameter of the second surface is in the range of one fifth to one tenth the diameter of the first surface.

* * * * *